United States Patent
Li et al.

(10) Patent No.: US 10,943,972 B2
(45) Date of Patent: Mar. 9, 2021

(54) PRECISION BEOL RESISTORS

(71) Applicant: International Business Machines Corporation, Armonk, NY (US)

(72) Inventors: Baozhen Li, South Burlington, VT (US); Kirk Peterson, Jericho, VT (US); John Sheets, Zumbrota, MN (US); Lawrence A. Clevenger, Saratoga Springs, NY (US); Junli Wang, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/419,619

(22) Filed: May 22, 2019

(65) Prior Publication Data
US 2019/0280080 A1   Sep. 12, 2019

Related U.S. Application Data

(63) Continuation of application No. 15/783,651, filed on Oct. 13, 2017, now Pat. No. 10,340,330.

(51) Int. Cl.
*H01L 49/02* (2006.01)
*H01L 21/48* (2006.01)
*H01L 23/522* (2006.01)

(52) U.S. Cl.
CPC ........... *H01L 28/20* (2013.01); *H01L 21/485* (2013.01); *H01L 23/5228* (2013.01)

(58) Field of Classification Search
None
See application file for complete search history.

(56) References Cited

U.S. PATENT DOCUMENTS

| | | |
|---|---|---|
| 6,242,999 B1 | 6/2001 | Nakayama et al. |
| 6,500,724 B1 | 12/2002 | Zurcher et al. |
| 7,485,540 B2 | 2/2009 | Chinthakindi et al. |

(Continued)

OTHER PUBLICATIONS

List of IBM Patents or Patent Applications Treated as Related dated May 22, 2019, 2 Pages.

*Primary Examiner* — Zandra V Smith
*Assistant Examiner* — Lawrence C Tynes, Jr.
(74) *Attorney, Agent, or Firm* — Scully, Scott, Murphy & Presser, P.C.; L. Jeffrey Kelly, Esq.

(57) ABSTRACT

A semiconductor structure that includes a resistor that is located within an interconnect dielectric material layer of an interconnect level is provided. The resistor includes a diffusion barrier material that is present at a bottom of a feature that is located in the interconnect dielectric material layer. In some embodiments, the resistor has a topmost surface that is located entirely beneath a topmost surface of the interconnect dielectric material layer. In such an embodiment, the resistor is provided by removing sidewall portions of a diffusion barrier liner that surrounds a metal-containing structure. The removal of the sidewall portions of the diffusion barrier liner reduces the parasitic noise that is contributed to the sidewall portions of a resistor that includes such a diffusion barrier liner. Improved precision can also be obtained since sidewall portions may have a high thickness variation which may adversely affect the resistor's precision.

18 Claims, 5 Drawing Sheets

(56) References Cited

U.S. PATENT DOCUMENTS

| | | |
|---|---|---|
| 7,768,055 B2 | 8/2010 | Chinthakindi et al. |
| 8,013,394 B2 | 9/2011 | Chinthakindi et al. |
| 8,035,228 B2 | 10/2011 | Yang |
| 8,563,336 B2 | 10/2013 | Chen et al. |
| 8,569,160 B2 | 10/2013 | Rinerson et al. |
| 9,064,786 B2 | 6/2015 | Di Sarro et al. |
| 9,252,201 B2 | 2/2016 | Booth et al. |
| 9,305,688 B2 | 4/2016 | Hao et al. |
| 9,627,250 B2 | 4/2017 | Wu et al. |
| 2005/0130383 A1 | 6/2005 | Divakaruni et al. |
| 2006/0170103 A1 | 8/2006 | Suh et al. |
| 2006/0231945 A1* | 10/2006 | Chinthakindi ...... H01L 23/3677 257/712 |
| 2007/0069334 A1 | 3/2007 | Beach et al. |
| 2008/0237800 A1 | 10/2008 | Chinthakindi et al. |
| 2012/0049997 A1 | 3/2012 | Lim et al. |
| 2012/0118619 A1 | 5/2012 | Booth, Jr. |
| 2014/0008764 A1 | 1/2014 | Yang et al. |
| 2014/0319350 A1* | 10/2014 | Yon ..................... G01J 5/20 250/338.4 |
| 2016/0218062 A1 | 7/2016 | Aggarwal et al. |

\* cited by examiner

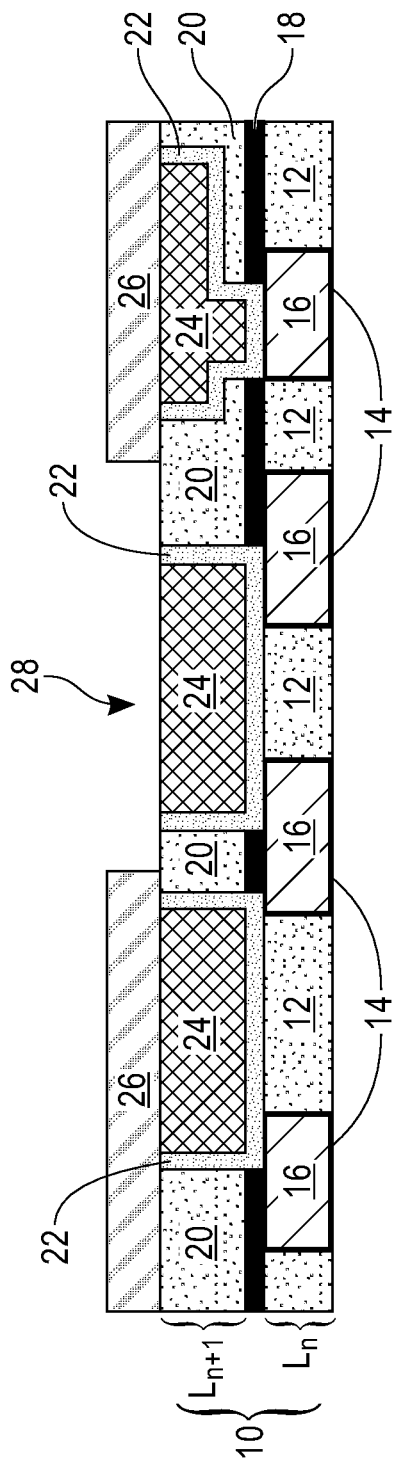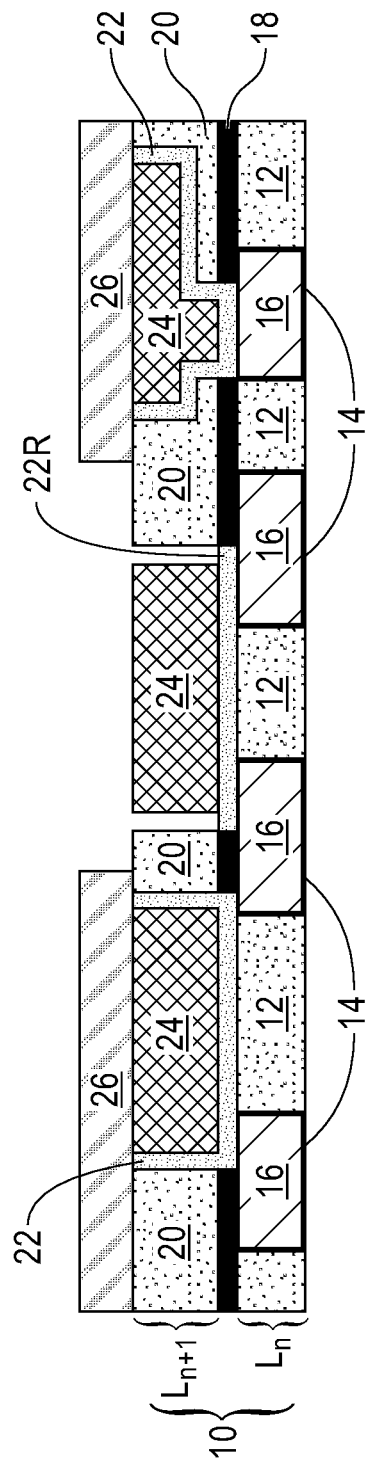

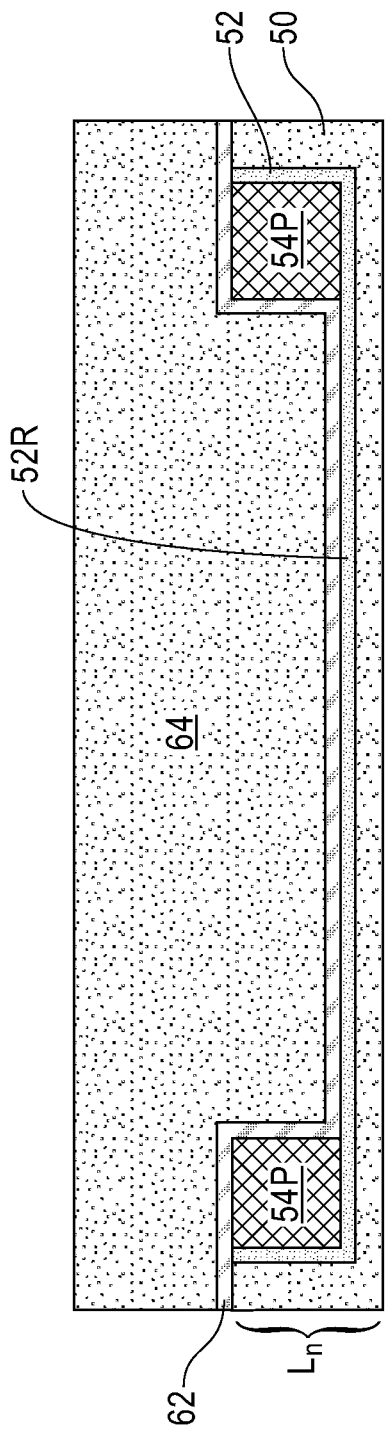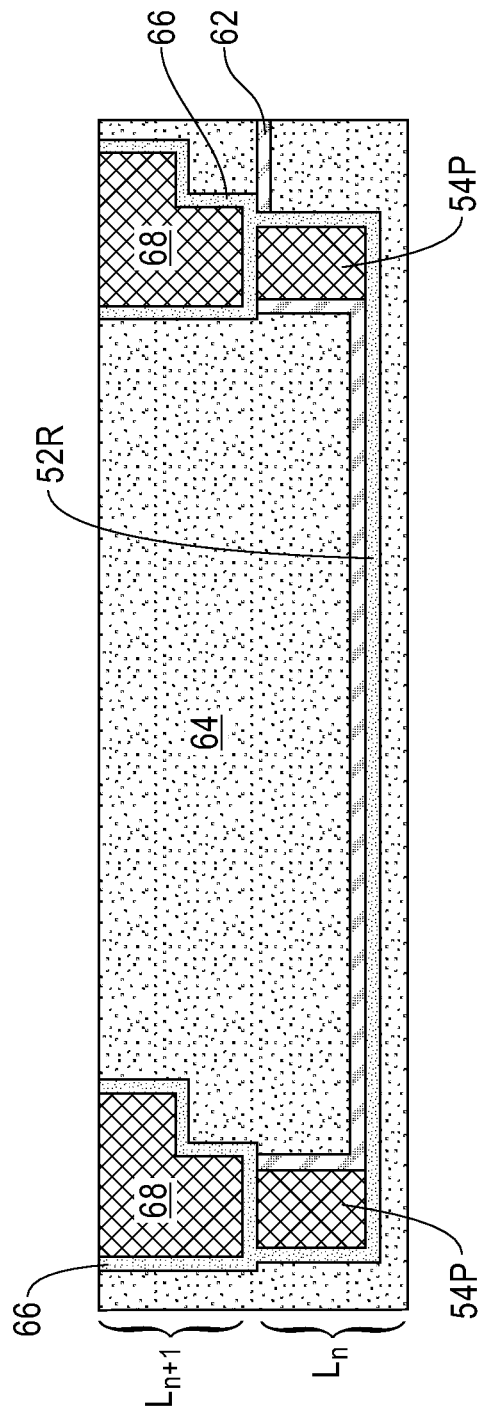

PRECISION BEOL RESISTORS

BACKGROUND

The present application relates to a semiconductor structure and a method of forming the same. More particularly, the present application relates to back-end-of-the-line (BEOL) resistors that have high precision as well as methods of forming such BEOL resistors.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

In semiconductor devices, it is well known to have a thin film resistor such as, for example, a resistor composed of TaN, embedded in the chip through either a damascene approach or a subtractive etch method. For example, and during back-end-of-the-line (BEOL) processing, a thin film resistor may be embedded in an interconnect dielectric material; such structures may be referred to as BEOL resistors. Prior art methods of forming thin film resistors embedded in an interconnect dielectric material are complicated and expensive. Moreover, topography issues arise when embedding a thin film resistor in an interconnect dielectric material which may degrade the final chip yield. Other issues with prior art methods of embedding a thin film resistor in an interconnect dielectric material include, but are not limited to, Joule heating and poor scaling capabilities.

Moreover, precision BEOL resistors used in analog circuits need to have small tolerances of variation and need to integrate in with the overall BEOL process flow in a way that minimizes cost, space and/or wiring congestion.

SUMMARY

A semiconductor structure that includes a resistor that is located within an interconnect dielectric material layer of an interconnect level is provided. In accordance with the present application, the resistor comprises a diffusion barrier material that is present at a bottom of a feature that is located in the interconnect dielectric material layer. In some embodiments, the resistor has a topmost surface that is located entirely beneath a topmost surface of the interconnect dielectric material layer. In such an embodiment, the resistor is provided by removing sidewall portions of a diffusion barrier liner that surrounds a metal-containing structure. The removal of the sidewall portions of the diffusion barrier liner reduces the parasitic noise that is contributed to the sidewall portions of a resistor that includes such a diffusion barrier liner. Improved precision can also be obtained since sidewall portions may have a high thickness variation which may adversely affect the resistor's precision. The semiconductor structure of the present application is devoid of any metallic structure that contacts a topmost surface of the resistor.

In one embodiment, the semiconductor structure includes a lower interconnect level including first metal-containing structures embedded within a first interconnect dielectric material layer. An upper interconnect level is located above the lower interconnect level and it includes second metal-containing structures embedded within a second interconnect dielectric material layer. A resistor is present in the upper interconnect level. In accordance with this embodiment, the resistor has a bottommost surface that is coplanar with a topmost surface of the first interconnect dielectric material layer and a topmost surface that is located entirely beneath a topmost surface of the second interconnect dielectric material layer. A dielectric cap covers an entirety of the topmost surface of the resistor.

In another embodiment, the semiconductor structure includes a lower interconnect level including a pair of spaced apart metal-containing portions embedded within an interconnect dielectric material layer. An upper interconnect level is located above the lower interconnect level and includes metal-containing structures embedded within a dielectric material layer, wherein each metal-containing structure is located directly above one of the metal-containing portions of the pair of metal-containing portions. A resistor is present in the lower interconnect level and between the pair of spaced apart metal-containing portions. A dielectric material (i.e., a dielectric cap or a dielectric material layer) is present on the entirety of the resistor.

In one embodiment, the method includes providing an interconnect level comprising metal-containing structures embedded within an interconnect dielectric material layer, wherein a diffusion barrier liner is present on sidewalls and a bottom wall of each metal-containing structure. Next, a patterned hard mask is formed on the interconnect level, wherein the patterned hard mask has an opening that physically exposes one of the metal-containing structures and the diffusion barrier liner that surrounds the physically exposed metal-containing structure. Vertical sidewall portions of the physically exposed diffusion barrier liner are removed, while maintaining a portion of the diffusion barrier liner beneath the physically exposed metal-containing structure, wherein the portion of the diffusion barrier liner that remains beneath the physically exposed metal-containing structure defines a resistor. Next, the physically exposed metal-containing structure is removed to physically expose the resistor, followed by the removal of the patterned hard mask. A dielectric stack is then formed above the resistor and the interconnect level.

In another embodiment, the method includes providing an interconnect level comprising a metal-containing structure embedded within an interconnect dielectric material layer, wherein a diffusion barrier liner is present on the sidewalls and a bottom wall of the metal-containing structure. Next, a patterned hard mask is formed on the interconnect level, wherein the patterned hard mask has an opening that physically exposes a portion of the metal-containing structure. The physically exposed portion of the metal-containing structure is removed to physically expose a portion of the diffusion barrier liner, wherein the physically exposed portion of the diffusion barrier liner defines a resistor that is present along a bottom portion of a resistor cavity that is formed between remaining portions of the metal-containing structure. The patterned hard mask is then removed and, thereafter, a dielectric material layer is formed above the interconnect level and above the resistor. Next, metal-containing structures are formed within the dielectric material layer and above each remaining portion of the metal-containing structure.

BRIEF DESCRIPTION OF SEVERAL VIEWS OF THE DRAWINGS

FIG. 1 is a cross sectional view of an exemplary semiconductor structure during an early stage of fabrication and including a patterned hard mask that is formed on an upper interconnect level in accordance with a first embodiment of the present application.

FIG. 2 is a cross sectional view of the exemplary semiconductor structure of FIG. 1 after removing vertical sidewall portions of a diffusion barrier liner that is present in the upper interconnect level and that is not protected by the patterned hard mask.

FIG. 10 is a cross sectional view of the exemplary semiconductor structure of FIG. 9 after removing the patterned hard mask, and forming a dielectric stack of a dielectric cap and a dielectric material layer.

FIG. 11 is a cross sectional view of the exemplary structure of FIG. 10 after forming an upper interconnect level within the dielectric material layer of the dielectric stack.

DETAILED DESCRIPTION

Figure 3:
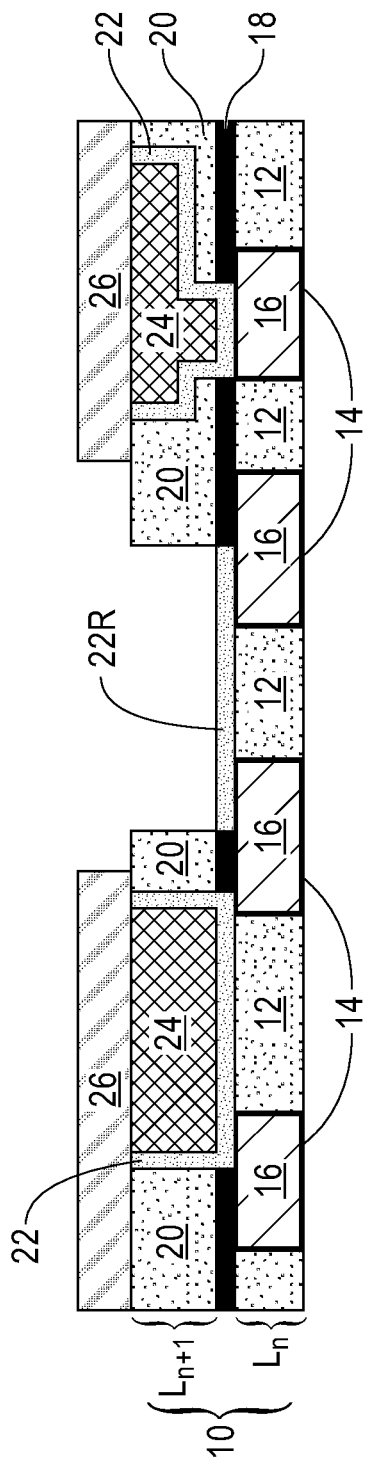
FIG. 3 is a cross sectional view of the exemplary semiconductor structure of FIG. 2 after removing the interconnect metal-containing structure that is present in the upper interconnect level and that is not protected by the patterned hard mask.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure during an early stage of fabrication and in accordance with a first embodiment of the present application. The exemplary semiconductor structure shown in FIG. 1 includes a patterned hard mask 26 that is formed on an upper interconnect level, $L_{n+1}$, of an interconnect structure 10. The patterned hard mask 26 includes an opening 28 that physically exposes an area of the upper interconnect level, $L_{n+1}$, in which a precision BEOL resistor in accordance with the present application will be subsequently formed. The patterned hard mask 26 covers interconnect device areas of the exemplary structure, i.e., areas in which interconnect metal-containing structures are to remain. The upper interconnect level, $L_{n+1}$, is located above a lower interconnect level $L_n$. In the present application, n is an integer starting at 1. In the illustrated embodiment, capping layer 18 is positioned between the lower interconnect level, $L_n$, and the upper interconnect level, $L_{n+1}$. In some embodiments, capping layer 18 is omitted.

The lower interconnect level, $L_n$, includes a first interconnect dielectric material layer 12 that includes a plurality of first metal-containing structures 16 embedded therein; the first metal-containing structures are electrically conductive. A first diffusion barrier liner 14 is also present that surrounds the sidewalls and the bottom wall (i.e., bottommost surface) of each first metal-containing structures 16 which is embedded in the first interconnect dielectric material layer 12. As is shown, the first metal-containing structures 16 and the first diffusion barrier liners 14 have topmost surfaces that are coplanar with each other as well as coplanar with a topmost surface of the first interconnect dielectric material layer 12. In some embodiments, the first diffusion barrier liners 14 may be omitted from the lower interconnect level, $L_n$. In some embodiments, the first interconnect dielectric material layer 12 may extend beneath each first metal-containing structure 16 so as to completely embed the first metal-containing structures 16.

The first interconnect dielectric material layer 12 of the lower interconnect level, $L_n$, may be composed of an inorganic dielectric material or an organic dielectric material. In some embodiments, first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, openings (not shown) are formed into the first interconnect dielectric material layer 12; each opening will house a first metal-containing structure 16 and, if present, the first diffusion barrier liner 14. The openings in the first interconnect dielectric material layer 12 may be via openings, line openings and/or combined via/lines openings. The openings may be formed by lithography and etching. In embodiments in which a combined via/line opening is formed, a second iteration of lithography and etching may be used to form such an opening.

In some embodiments, a first diffusion barrier material is then formed within each opening and on an exposed topmost surface of the first interconnect dielectric material layer 12; the first diffusion barrier material will provide the first diffusion barrier liner 14 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirely fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier mateiral, the optional plating seed layer is not needed. The optional plating seed layer is employed to selectively promote subsequent electroplating of a pre-selected conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, a first interconnect metal or metal alloy is then formed into each opening and, if present, atop the first diffusion barrier material. The first interconnect metal or metal alloy provides the first metal-containing structures 16 of the present application. The first interconnect metal or metal alloy can be formed utilizing a deposition process such as, for example, CVD, PECVD, sputtering, chemical solution deposition or plating. In one embodiment, a bottom-up plating process is employed in forming the first interconnect metal or metal alloy. In some embodiments, the first interconnect metal or metal alloy is formed above the topmost surface of the first interconnect dielectric material layer 12.

Following the deposition of the first interconnect metal or metal alloy, a planarization process such as, for example, chemical mechanical polishing (CMP) and/or grinding, can be used to remove all interconnect metal or metal alloy (i.e., overburden material) that is present outside each of the openings forming the first metal-containing structures 16 shown in FIG. 1. The planarization stops on a topmost surface of the first interconnect dielectric material layer 12. Thus, and if present, the planarization process also removes the first diffusion barrier material from the topmost surface of the first interconnect dielectric material layer 12. The remaining portion of the first diffusion barrier material that is present in each opening is referred to herein as the first diffusion barrier liner 14, while the remaining first interconnect metal or metal alloy that is present in each opening may be referred to as the first metal-containing structure 16. Collectively, the first interconnect dielectric material layer 12, each optional first diffusion barrier liner 14, and each first metal-containing structure 16 define the lower interconnect level, $L_n$, of the present application.

Next, and in some embodiments, a capping layer 18 can be formed on the physically exposed topmost surface of the lower interconnect level, $L_n$, of the present application. In some embodiments, capping layer 18 can be omitted. When present, the capping layer 18 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC (N,H)) or a multilayered stack of at least one of the aforementioned dielectric capping materials. The capping material that provides the capping layer 18 may be formed utilizing a deposition process such as, for example, CVD, PECVD, ALD, chemical solution deposition or evaporation. When present, capping layer 18 may have a thickness from 10 nm to 100 nm. Other thicknesses that are lesser than 10 nm, or greater than 100 nm may also be used as the thickness of the capping layer 18.

In the illustrated embodiment of FIG. 1, the upper interconnect level, $L_{n+1}$, is then formed on the capping layer 18. When the capping layer 18 is omitted, the upper interconnect level, $L_{n+1}$, can be formed upon the lower interconnect level, $L_n$.

The upper interconnect level, $L_{n+1}$, includes a second interconnect dielectric material layer 20, second diffusion barrier liners 22, and second metal-containing structures 24; the second metal-containing structures are electrically conductive. As is shown in FIG. 1, each second diffusion barrier liner 22 is present on the sidewalls and bottom wall (and thus surrounds) each second metal-containing structure 24. As is shown, the second metal-containing structures 24 and the second diffusion barrier liners 22 have topmost surfaces that are coplanar with each other as well as coplanar with a topmost surface of the second interconnect dielectric material layer 20. In the illustrated embodiment, a bottommost surface of a horizontal portion of each second diffusion barrier liner 22 contacts a topmost surface of at least one of the underlying first metal-containing structures 16. It is noted that some of the second metal-containing structures 24 will be maintained in the second interconnect dielectric material layer 20, while at least one of the second metal-containing structures 16 that is present in a via or line opening and within a resistor area of the exemplary structure will be further processed herein to provide a precision resistor of the present application.

The second interconnect dielectric material layer 20 may include one of the interconnect dielectric materials mentioned above for the first interconnect dielectric material layer 12. In some embodiments, the second interconnect dielectric material layer 20 includes a same interconnect dielectric material as the first interconnect dielectric material layer 12. In other embodiments, the second interconnect dielectric material layer 20 includes a different interconnect dielectric material than the first interconnect dielectric material layer 12. The second interconnect dielectric material layer 20 may be porous or non-porous, have a thickness within the thickness range of the first interconnect dielectric material layer 12, and be formed utilizing one of the deposition processes used in providing the first interconnect dielectric material layer 12.

Openings can then be formed into the second interconnect dielectric material layer 20 and, if present, capping layer 18. The openings that are formed into the second interconnect dielectric material layer 20 and, if present, capping layer 18 may include line openings, via openings, and/or combined via/line openings, with the proviso that at least one of the openings in a resistor area of the exemplary structure will be a via opening or a line opening. The openings are formed by lithography and etching as defined above.

A second diffusion barrier material and a second interconnect metal or metal alloy can then be formed into the openings that are formed into the second interconnect dielectric material layer 20 and, if present, capping layer 18 and atop the second interconnect dielectric material layer 20. The second diffusion barrier material may include one of the diffusion barrier materials mentioned above for the first diffusion barrier material. In one embodiment, the first and second diffusion barrier materials may be composed of a same diffusion barrier material. In another embodiment, the first and second diffusion barrier materials are composed of different diffusion barrier materials. The second diffusion barrier material may be formed utilizing one of the deposition processes mentioned above for forming the first diffusion barrier material, and the second diffusion barrier material may have a thickness within the thickness range mentioned above for the first diffusion barrier material. After forming the second diffusion barrier material, an optional plating seed layer may be formed.

Next, the second interconnect metal or metal alloy is formed above the second diffusion barrier material. The second interconnect metal or metal alloy may include one of the interconnect metals or metal alloys mentioned above for the first interconnect metal or metal alloy. In one embodiment, the first interconnect metal or metal alloy is a same interconnect metal or metal alloy as the second interconnect metal or metal alloy. In another embodiment, the first interconnect metal or metal alloy is a different interconnect metal or metal alloy than the second interconnect metal or metal alloy. The second interconnect metal or metal alloy may be formed utilizing one of the techniques mentioned above for forming the first interconnect metal or metal alloy.

Following the deposition of the second interconnect metal or metal alloy, a planarization process such as, for example, chemical mechanical polishing (CMP) and/or grinding, can be used to remove all interconnect metal or metal alloy (i.e., overburden material) that is present outside each the opening forming the second metal-containing structures 24 shown in FIG. 1. The planarization stops on a topmost surface of the second interconnect dielectric material layer 20. The planarization process also removes the second diffusion barrier material from the topmost surface of the second interconnect dielectric material layer 20. The remaining portion of the second diffusion barrier material that is present in each opening is referred to herein as the second diffusion barrier liner 22, while the remaining second interconnect metal or metal alloy that is present in each opening may be referred to as the second metal-containing structure 24. Collectively, the second interconnect dielectric material layer 20, each second diffusion barrier liner 22, and each second metal-containing structure 24 define the upper interconnect level, $L_{n+1}$, of the present application.

Next, a layer of hard mask material is formed on a physically exposed surface of the upper interconnect level, $L_{n+1}$, and then the layer of hard mask material is patterned by lithography and etching to provide patterned hard mask 26 having opening 28. The opening 28 that is formed into the layer of hard mask material defines an area in the structure in which a precision BEOL resistor will be subsequently formed. Although a single opening 28 is shown and described, a plurality of openings may be formed into the layer of hard mask material to define areas in which other BEOL resistors can be formed. The patterned hard mask 26 may include a dielectric hard mask material such as, for example, silicon nitride or silicon oxynitride. The layer of hard mask material may be formed utilizing a deposition process such as, for example, CVD, PECVD, or physical vapor deposition (PVD). The layer of hard mask material may have a thickness from 10 nm to 50 nm; other thicknesses can also be used as the thickness of the hard mask material.

The opening 28 that is present in the patterned hard mask 26 physically exposes a second metal-containing structure 24 and a second diffusion barrier liner 22 that is within the resistor area of the exemplary structure. Portions of the second interconnect dielectric material layer 20 in the resistor area may also be physically exposed by opening 28.

Referring now to FIG. 2, there is illustrated the exemplary semiconductor structure of FIG. 1 after removing vertical sidewall portions of the second diffusion barrier liner 22 that is present in the resistor area and that is not protected by the patterned hard mask 26. The vertical sidewall portions of the physically exposed second diffusion barrier liner 22 may be removed utilizing an etch process that is selective in removing the second diffusion barrier material relative to the interconnect dielectric material that provides the second interconnect dielectric material layer 20 or the interconnect metal or metal alloy that provides the second metal-containing structure 24. In one embodiment, the etch may be a dry etching process such as, for example, reactive ion etching or plasma etching. In another embodiment, the etch may be a chemical wet etch process in which a chemical etchant is employed. In one example, and when TaN is employed as the diffusion barrier material of the second diffusion barrier liner 22, a mixture of acids and chemical compounds, such as, for example, hydrogen, fluoride, hydrogen chloride, nitric acid and sulfuric acid, can be used to remove the vertical portions of the physically exposed second diffusion barrier liner 22.

After etching of the vertical sidewall portions of the physically exposed second diffusion barrier liner 22, a horizontal portion of the physically exposed second diffusion barrier liner 22 remains. This remaining horizontal portion of the physically exposed second diffusion barrier liner 22 may be referred to herein as resistor 22R. In this embodiment, the resistor 22R has a bottommost surface that contacts at least one of the underlying first metal-containing structures 16 of the lower interconnect level, $L_n$.

Referring now to FIG. 3, there is illustrated the exemplary semiconductor structure of FIG. 2 after removing the physically exposed second interconnect metal-containing structure 24 that is not protected by the patterned hard mask 26; as is shown the entirety of the physically exposed second interconnect metal-containing structure 24 is removed so as to physically expose the underlying resistor 22R.

The physically exposed second interconnect metal-containing structure 24 can be removed utilizing an etch process that is selective in removing the second interconnect metal or metal alloy that provides the second metal-containing structure 24 relative to the material of resistor 22R and the interconnect dielectric material that provides the second interconnect dielectric material layer 20. In one embodiment, the etch may be a dry etching process such as, for example, reactive ion etching or plasma etching. In another embodiment, the etch may be a chemical wet etch process in which a chemical etchant is employed. In one example, and when Cu is employed as the second interconnect metal or metal alloy, a mixture of acids and chemical compounds, such as, for example, hydrogen, fluoride, hydrogen chloride, nitric acid and sulfuric acid, can be used to remove the vertical sidewall portions of the physically exposed second metal-containing structure 24.

Figure 4:
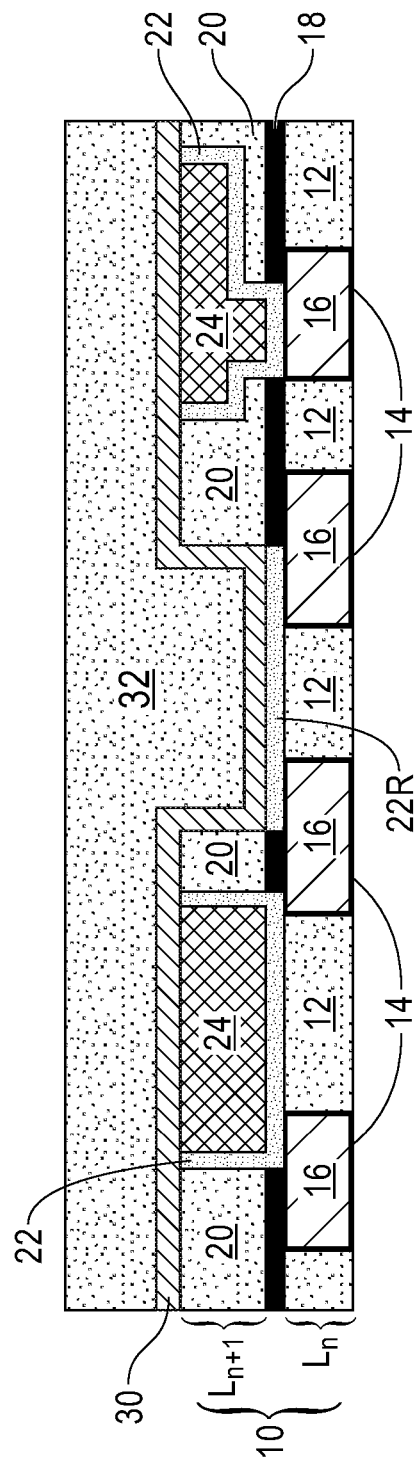
FIG. 4 is a cross sectional view of the exemplary semiconductor structure of FIG. 3 after removing the patterned hard mask, and forming a dielectric stack of a dielectric cap and a dielectric material layer.

Referring now to FIG. 4, there is illustrated the exemplary semiconductor structure of FIG. 3 after removing the patterned hard mask 26, and forming a dielectric stack of a dielectric cap 30 and a dielectric material layer 32. In this embodiment, the topmost surface of the resistor 22R is entirely covered by the dielectric cap 30. The patterned hard mask 26 may be removed by utilizing any conventional material removal process such as, for example, chemical mechanical polishing.

The dielectric cap 30 includes one of the dielectric materials mentioned above for capping layer 18. In one embodiment, dielectric cap 30 includes a same dielectric material as capping layer 18. In another embodiment, dielectric cap 30 may include a different dielectric material than capping layer 18. Dielectric cap 30 may be formed utilizing one of the deposition processes mentioned above for forming capping layer 18, and dielectric cap 30 may have a thickness within the thickness range mentioned above for capping layer 18.

The dielectric material layer 32 may include one of the interconnect dielectric materials mentioned above for the first interconnect dielectric material 12. The dielectric material layer 32 may be formed utilizing one of the deposition processes mentioned above for forming the first interconnect dielectric material layer 12. In some embodiments, a planarization process may follow the deposition of the dielectric material that provides the dielectric material layer 32. Dielectric material layer 32 is composed of a different dielectric material than dielectric cap 30.

FIG. 4 illustrates one exemplary structure of the present application. Notably, the exemplary structure of FIG. 4 includes a lower interconnect level, $L_n$, including first metal-containing structures 16 embedded within a first interconnect dielectric material layer 12. An upper interconnect level, $L_{n+1}$, is located above the lower interconnect level, $L_n$, and the upper interconnect level, $L_{n+1}$, includes second metal-containing structures 24 embedded within a second interconnect dielectric material layer 20. A resistor 22R is present in the upper interconnect level, $L_{n+1}$. In accordance with this embodiment, the resistor 22R has a bottommost surface that is coplanar with a topmost surface of the first interconnect dielectric material layer 12 and a topmost surface that is located entirely beneath a topmost surface of the second interconnect dielectric material layer 20. In this embodiment, a dielectric cap 30 is present on an entirety of the topmost surface of the resistor 22R. It is noted that the resistor 22R and the second metal-containing structures 24 (interconnect structures) are present in a same interconnect level as each other. Also, the resistor 22R and the second diffusion barrier liners 22 that remain in the interconnect area are composed of a same diffusion barrier material. Further, the exemplary structure of FIG. 4 is devoid of any metallic structure that contacts a topmost surface of the resistor 22R.

In this embodiment, at least a portion of a bottommost surface of the resistor 22R directly contacts a topmost surface portion of a neighboring pair of first metal-containing structures 16 embedded within the first interconnect dielectric material layer 12; no upper contact is needed. Notably, end portions of the bottommost surface of the resistor 22R directly contact a topmost surface of a neighboring pair of first metal-containing structures 16 embedded within the first interconnect dielectric material layer 12.

Figure 5:
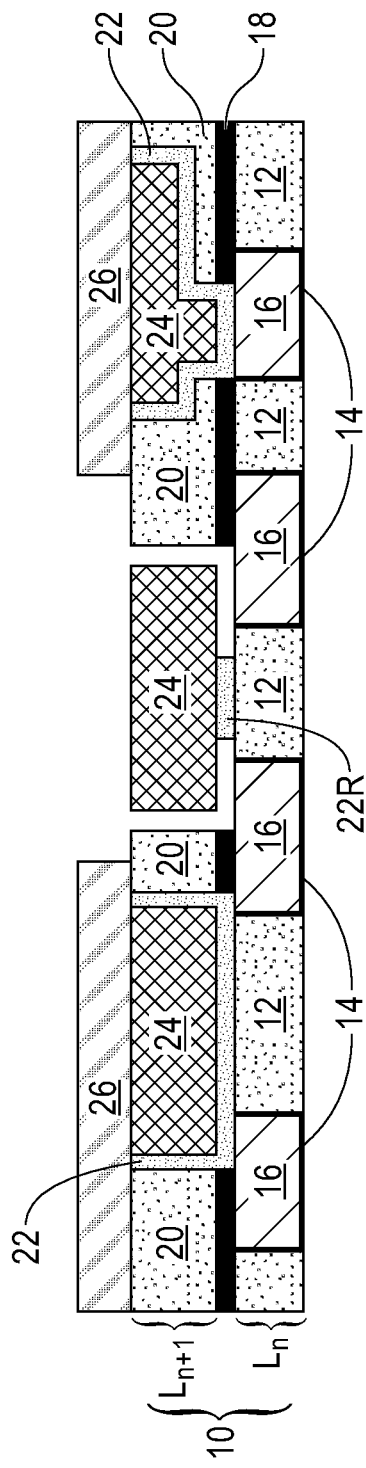
FIG. 5 is a cross sectional view of the exemplary semiconductor structure of FIG. 2 after removing end portions of a remaining horizontal portion of the diffusion barrier liner in accordance with a variation of the first embodiment of the application.

Referring now to FIG. 5, there is illustrated the exemplary semiconductor structure of FIG. 2 after removing end portions of a remaining horizontal portion of the diffusion liner (i.e., the resistor 22R) in accordance with a variation of the first embodiment of the application. In this embodiment, the remaining resistor 22R is trimmed to a desired length and does not directly contact any of the underlying first metal-containing structures 16 that are present in the lower interconnect level, L1. This step of the present application may be performed utilizing a laterally etching process that is selective in removing the end portions of the resistor 22R.

Figure 6:
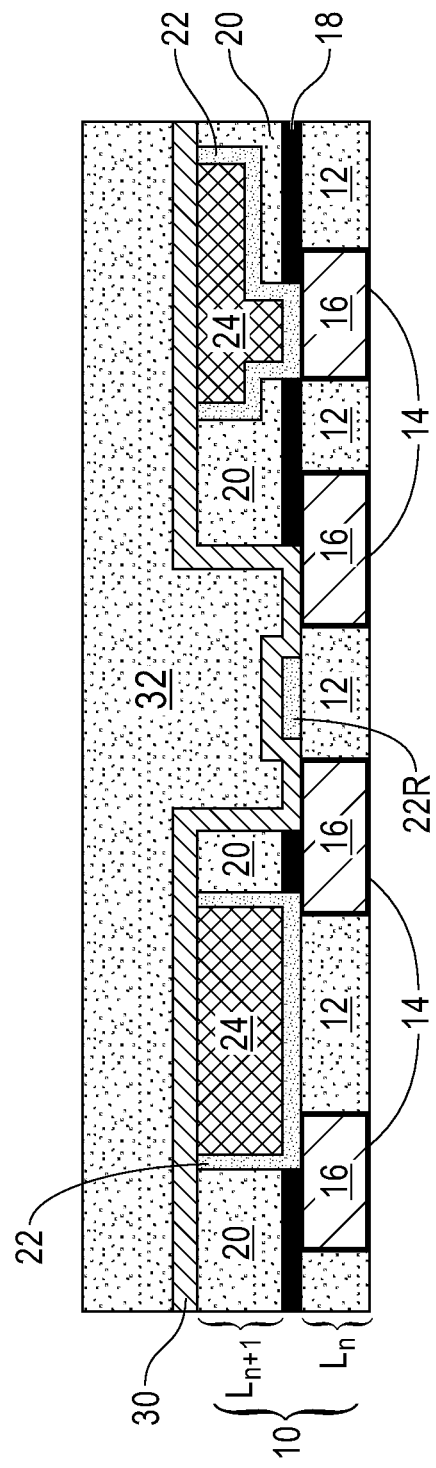
FIG. 6 is a cross sectional view of the exemplary semiconductor structure of FIG. 5 after removing the interconnect metal-containing structure that is present in the upper interconnect level and that is not protected by the patterned hard mask, removing the patterned hard mask, and forming a dielectric stack of a dielectric cap and a dielectric material layer.

Referring now to FIG. 6, there is illustrated the exemplary semiconductor structure of FIG. 5 after removing the second metal-containing structure 24 that is not protected by the patterned hard mask 26, removing the patterned hard mask 26, and forming a dielectric stack of a dielectric cap 30 and a dielectric material layer 32. The removal of the second metal-containing structure 24 and the patterned hard mask 26 of this variation of the present application are performed utilizing the techniques mentioned above in the previously embodiment of the present application; See, for example, the description provided above for FIG. 3 (second metal-containing structure removal) and FIG. 4 (patterned hard mask removal). The dielectric stack including the dielectric cap 30 and the dielectric material layer 32 can be formed and include materials as described above in FIG. 4 of the present application.

FIG. 6 illustrates another exemplary structure of the present application. Notably, the exemplary structure of FIG. 6 includes a lower interconnect level, $L_n$, including first metal-containing structures 16 embedded within a first interconnect dielectric material layer 12. An upper interconnect level, $L_{n+1}$, is located above the lower interconnect level, $L_n$, and the upper interconnect level, $L_{n+1}$ includes second metal-containing structures 24 embedded within a second interconnect dielectric material layer 20. A resistor 22R is present in the upper interconnect level, $L_{n+1}$. In accordance with this embodiment, the resistor 22R has a bottommost surface that is coplanar with a topmost surface of the first interconnect dielectric material layer 12 and a topmost surface that is located entirely beneath a topmost surface of the second interconnect dielectric material layer 20. In this embodiment, a dielectric cap 30 is present on an entirety of the topmost surface of the resistor 22R and a portion of the dielectric cap 30 contacts sidewalls of the resistor 22R. It is noted that the resistor 22R and the second metal-containing structures 24 (interconnect structures) are present in a same interconnect level as each other. Also, the resistor 22R and the second diffusion barrier liners 22 that remain in the interconnect area are composed of a same diffusion barrier material. Further, the exemplary structure of this embodiment is devoid of any metallic structure that contacts a topmost surface of the resistor.

In this embodiment, an entirety of the bottommost surface of the resistor 22R directly contacts a topmost surface of the first interconnect dielectric material layer 12. Such a structure has improved cooling as compared to the structure shown in FIG. 4. In this embodiment, dielectric cap 30 directly contacts the sidewall surfaces of the resistor 22R which has been trimmed.

Figure 7:
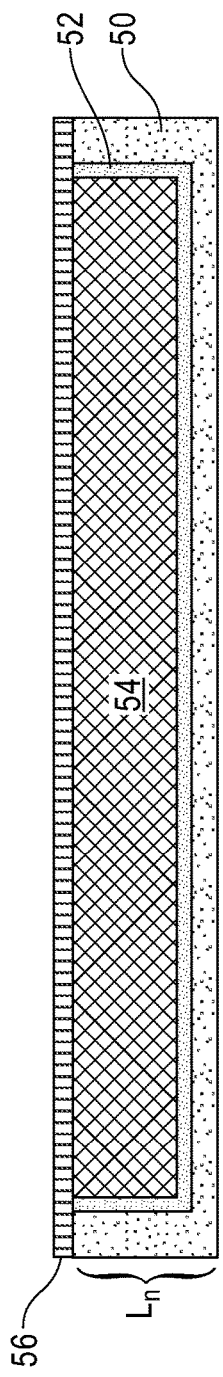
FIG. 7 is a cross sectional view of an exemplary semiconductor structure during an early stage of fabrication including a capping layer that is located on a lower interconnect level in accordance with a second embodiment of the present application.

Referring now to FIG. 7, there is illustrated an exemplary semiconductor structure during an early stage of fabrication in accordance with a second embodiment of the present application. The exemplary structure of FIG. 7 includes a capping layer 56 that is located on an interconnect level, $L_n$. The interconnect level, $L_n$, of this embodiment of the present application includes an interconnect dielectric material layer 50 having a metal-containing structure 54 embedded therein. As is shown, a diffusion barrier liner 52 is present on the sidewalls and along a bottom wall of the metal-containing structure 54 thus separating the metal-containing structure 54 from the interconnect dielectric material layer 50. The diffusion barrier liner 52 and the metal-containing structure 54 have topmost surfaces that are coplanar with each other as well as being coplanar with a topmost surface of the interconnect dielectric material layer 50.

The interconnect dielectric material layer 50 of this embodiment of the present application may include one of the interconnect dielectric materials mentioned above for the first interconnect dielectric material layer 12. The interconnect dielectric material layer 50 may be porous or non-porous, have a thickness within the thickness range of the first interconnect dielectric material layer 12, and be formed utilizing one of the deposition processed used in providing the first interconnect dielectric material layer 12.

Openings can then be formed into the interconnect dielectric material layer 50; in the drawings of this embodiment a single opening is formed and further processed as described herein below. In this embodiment, the opening in the resistor area is a line opening. The openings are formed by lithography and etching as defined above.

A diffusion barrier material and an interconnect metal or metal alloy can then be formed into the openings that are formed into the interconnect dielectric material layer 50 and atop the interconnect dielectric material layer 50. The diffusion barrier material may include one of the diffusion barrier materials mentioned above for the first diffusion barrier material. The diffusion barrier material of this embodiment may be formed utilizing one of the deposition processes mentioned above for forming the first diffusion barrier material, and the diffusion barrier material of this embodiment may have a thickness within the thickness range mentioned above for the first diffusion barrier material. After forming the diffusion barrier material, an optional plating seed layer may be formed.

Next, the interconnect metal or metal alloy is formed above the diffusion barrier material. The interconnect metal or metal alloy may include one of the metals or metal alloys mentioned above for the first interconnect metal or metal alloy. The interconnect metal or metal alloy may be formed utilizing one of the techniques mentioned above for forming the first interconnect metal or metal alloy.

Following the deposition of the interconnect metal or metal alloy, a planarization process such as, for example, chemical mechanical polishing (CMP) and/or grinding, can be used to remove all interconnect metal or metal alloy (i.e., overburden material) that is present outside each the opening forming the metal-containing structure 54 shown in FIG. 7. The planarization stops on a topmost surface of the interconnect dielectric material layer 50. Thus, the planarization process also removes the diffusion barrier material from the topmost surface of the interconnect dielectric material layer 50. The remaining portion of the diffusion barrier material that is present the opening is referred to herein as the diffusion barrier liner 52, while the remaining interconnect metal or metal alloy that is present in the opening may be referred to as the metal-containing structure 54. Collectively, the interconnect dielectric material layer 50, the diffusion barrier liner 52, and the metal-containing structure 54 define the interconnect level, $L_n$, of this embodiment of the present application.

Next, the capping layer 56 is formed upon the interconnect level, $L_n$. The capping layer 56 may include one of the dielectric capping materials mentioned above for capping layer 18. The capping layer 56 of this embodiment may be formed utilizing one of the deposition processes mentioned above for forming the capping layer 18, and the capping layer 56 of this embodiment may have a thickness within the thickness range mentioned above for the capping layer 18.

Figure 8:
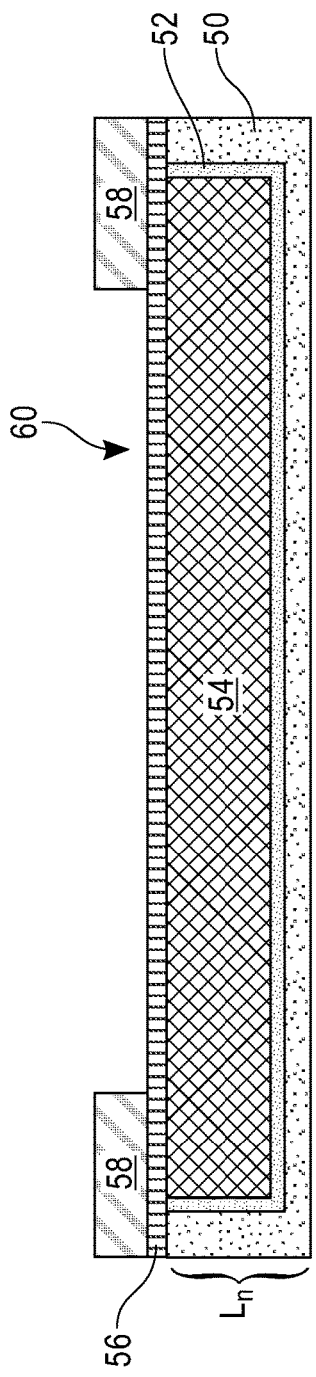
FIG. 8 is a cross sectional view of the exemplary structure of FIG. 7 after forming a patterned hard mask on the capping layer, the patterned hard mask including an opening that physically exposes a portion of the capping layer.

Referring now to FIG. 8, there is illustrated the exemplary structure of FIG. 7 after forming a patterned hard mask 58 on the capping layer 56, the patterned hard mask 58 includes an opening 60 the physically exposes a portion of the capping layer 56. The opening 60 that is formed defines an area in the structure in which a precision BEOL resistor will be subsequently formed. The patterned hard mask 58 may include one of the hard mask materials mentioned above for patterned hard mask 26. The hard mask material that provides the patterned hard mask 58 of this embodiment may be formed utilizing one of the deposition processes mentioned above for forming the hard mask material for providing patterned hard mask 26, and the hard mask material that provides the patterned hard mask 58 of this embodiment may have a thickness within the thickness range mentioned above for the hard mask material for providing patterned hard mask 26. Patterning of the hard mask material may be performed by lithography and etching.

Figure 9:
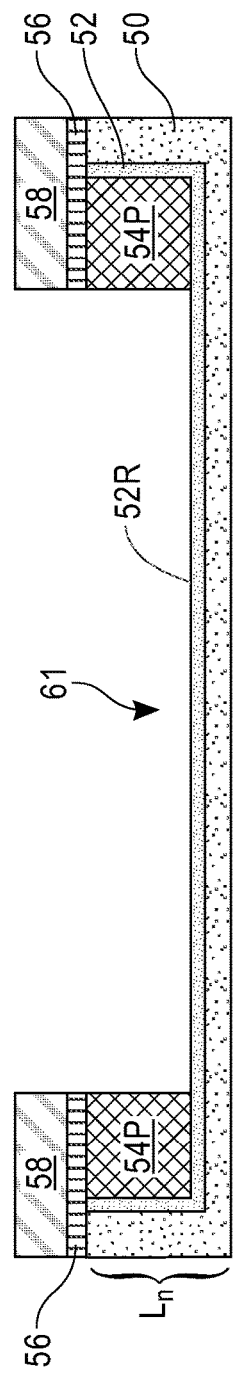
FIG. 9 is a cross sectional view of the exemplary semiconductor structure of FIG. 8 after removing the physically exposed portion of the capping layer and a metal-containing structure that is located beneath the physically exposed portion of the capping layer.

Referring now to FIG. 9, there is illustrated the exemplary semiconductor structure of FIG. 8 after removing the physically exposed portion of the capping layer 56 and the metal-containing structure 54 that is located beneath the physically exposed portion of the capping layer 56. The removal of the physically exposed portion of the capping layer 56 and the metal-containing structure 54 may be performed utilizing one or more etching processes. In one example, a first etch is used to open the capping layer 56, while a second etch is used to remove the metal-containing structure 54. In yet another example, a single etch is used to remove the physically exposed portion of the capping layer 56 and the metal-containing structure 54. Notwithstanding whether a single etch or a two step etch process is used, the at least one etching includes an anisotropic etch such as, for example, reaction ion etching. After removing the metal-containing structure 54 that is located beneath the physically exposed portion of the capping layer 56, a portion of the diffusion barrier liner 52 within a resistor cavity 61 is now physically exposed. The physically exposed portion of the diffusion barrier liner 52 may be referred to herein as a resistor 52R.

As is shown in FIG. 9, portions of the metal-containing structure 54 remaining laterally adjacent the resistor cavity 61. The remaining portions of the metal-containing structure 54 are referred to herein as metal-containing portions 54P; each metal-containing portion 54P is electrically conductive.

Referring now to FIG. 10, there is illustrated the exemplary semiconductor structure of FIG. 9 after removing the patterned hard mask 58, and forming a dielectric stack of a dielectric cap 62 and a dielectric material layer 64. In some embodiments, dielectric cap 62 may be omitted. The patterned hard mask 58 may be removed utilizing any material removal process such as, for example, planarization. The dielectric stack including the optional dielectric cap 62 and the dielectric material layer 64 can be formed and include materials as described above in FIG. 4 of the present application.

Referring now to FIG. 11, there is illustrated the exemplary structure of FIG. 10 after forming an upper interconnect level, $L_{n+1}$, within the dielectric material layer 64 of the dielectric stack. The forming of the upper interconnect level, $L_{n+1}$, includes forming openings into the dielectric material layer 64, and optionally into the cap layer 62 by lithography and etching and then forming a diffusion barrier liner 66 and a metal-containing structure 68 into the openings. The diffusion barrier liner 66 and the metal-containing structure 68 include materials as described above for the first diffusion barrier liners 14 and first metal-containing structures 16. The diffusion barrier liner 66 and the metal-containing structure 68 can be formed utilizing techniques as mentioned above for forming the first diffusion barrier liner and first metal-containing structure. As is shown, the diffusion barrier liner 66 and the metal-containing structure 68 that provide the upper interconnect level, $L_{n+1}$, are located directly above the remaining metal-containing structures 54P that are present in the lower interconnect level, $L_n$.

FIG. 11 exemplifies another semiconductor structure in accordance with the present application. The exemplary structure of FIG. 11 includes a lower interconnect level, $L_n$, including a pair of spaced apart metal-containing portions 54P embedded within an interconnect dielectric material layer 50. An upper interconnect level, $L_{n+1}$, is located above the lower interconnect level, $L_n$, and includes metal-containing structures 68 embedded within a dielectric material layer 64, wherein each metal-containing structure 68 is located directly above one of the metal-containing portions 54P of the pair of spaced apart metal-containing portions. A resistor 52R in the lower interconnect level and between the pair of spaced apart metal-containing portions 54P. In this embodiment, the metal-containing portions 54P within the interconnect dielectric material layer 50 provide contact (i.e., from the sides) to the resistor 52R; no metallic structure is present that contacts a topmost surface of the resistor.

It is noted that the resistors shown in FIGS. 4, 6, and 11 are precision BEOL resistors, without any metallic structures that contact a topmost surface of the resistor, that have small tolerances of variation and are readily integrated in with the overall BEOL process flow in a way that minimizes cost, space and/or wiring congestion.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a lower interconnect level including first metal-containing structures embedded within a first interconnect dielectric material layer;
   an upper interconnect level located above the lower interconnect level and comprising second metal-containing structures embedded within a second interconnect dielectric material layer;
   a resistor present in the upper interconnect level, wherein the resistor has a bottommost surface that is coplanar with, and only contacting, a topmost surface of the first interconnect dielectric material layer and a topmost surface that is located entirely beneath a topmost surface of the second interconnect dielectric material layer; and
   a dielectric cap located on an entirety of the topmost surface of the resistor, wherein the dielectric cap further directly contacts a topmost surface of the second interconnect dielectric material layer, and directly contacts a topmost surface of the second metal-containing structures.

2. The semiconductor structure of claim 1, further comprising a capping layer located between the lower interconnect level and the upper interconnect level.

3. The semiconductor structure of claim 2, wherein the topmost surface of the resistor is coplanar with a topmost surface of the capping layer, and wherein the bottommost surface of the resistor is coplanar with a bottommost surface of the capping layer.

4. The semiconductor structure of claim 2, wherein the dielectric cap is composed of silicon carbide, silicon nitride, silicon dioxide, a carbon-doped oxide, or a nitrogen and hydrogen doped silicon carbon.

5. The semiconductor structure of claim 1, further comprising a diffusion barrier liner present on sidewalls and along a bottom wall of each of the second metal-containing structures, and wherein the diffusion barrier liner and the resistor comprise a same diffusion barrier material.

6. The semiconductor structure of claim 5, wherein the diffusion barrier material comprises Ta, TaN, Ti, TiN, Ru, RuN, RuTa, RuTaN, W, or WN.

7. The semiconductor structure of claim 1, further comprising a dielectric material layer located on the dielectric cap.

8. The semiconductor structure of claim 7, wherein a first portion of the dielectric material layer is present in the upper interconnect level, and a second portion of the dielectric material layer extends above the upper interconnect level.

9. The semiconductor structure of claim 1, wherein the structure is devoid of any metallic structure that contacts the topmost surface of the resistor.

10. The semiconductor structure of claim 1, wherein the dielectric cap further directly contacts sidewall surfaces of the resistor.

11. The semiconductor structure of claim 1, wherein resistor comprises Ta, TaN, Ti, TiN, Ru, RuN, RuTa, RuTaN, W, or WN.

12. The semiconductor structure of claim 1, wherein the resistor and the second metal-containing structures are present in a same interconnect level as each other.

13. The semiconductor structure of claim 1, wherein the dielectric cap is composed of silicon carbide, silicon nitride, silicon dioxide, a carbon-doped oxide, or a nitrogen and hydrogen doped silicon carbon.

14. The semiconductor structure of claim 1, wherein a height of the resistor is less than a height of the second interconnect dielectric material layer.

15. The semiconductor structure of claim 1, wherein the second interconnect dielectric material layer has a topmost surface that is coplanar with a topmost surface of the second metal-containing structures.

16. The semiconductor structure of claim 1, wherein the resistor does not extend onto any of the first metal-containing structures.

17. The semiconductor structure of claim 1, wherein the first metal-containing structures and the second metal-containing structures are composed of copper.

18. A semiconductor structure comprising:
a lower interconnect level including first metal-containing structures embedded within a first interconnect dielectric material layer;
an upper interconnect level located above the lower interconnect level and comprising second metal-containing structures embedded within a second interconnect dielectric material layer;
a resistor present in the upper interconnect level, wherein the resistor has a bottommost surface that is coplanar with, and only contacting, a topmost surface of the first interconnect dielectric material layer and a topmost surface that is located entirely beneath a topmost surface of the second interconnect dielectric material layer;
a dielectric cap located on an entirety of the topmost surface of the resistor; and
a capping layer located between the lower interconnect level and the upper interconnect level, wherein the topmost surface of the resistor is coplanar with a topmost surface of the capping layer, and wherein the bottommost surface of the resistor is coplanar with a bottommost surface of the capping layer.

* * * * *